(12) United States Patent
Kwon et al.

(10) Patent No.: US 9,761,650 B2
(45) Date of Patent: Sep. 12, 2017

(54) THIN-FILM TRANSISTOR, METHOD FOR MANUFACTURING THE SAME AND DISPLAY DEVICE COMPRISING THE SAME

(71) Applicant: LG Display Co. Ltd., Seoul (KR)

(72) Inventors: SeYeoul Kwon, Goyang-si (KR); MinGu Cho, Goyang-si (KR); Sangcheon Youn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/101,144

(22) Filed: Dec. 9, 2013

(65) Prior Publication Data

US 2014/0183476 A1 Jul. 3, 2014

(30) Foreign Application Priority Data

Dec. 27, 2012 (KR) .................. 10-2012-0155587
Nov. 28, 2013 (KR) .................. 10-2013-0146139

(51) Int. Cl.
*H01L 31/036* (2006.01)
*H01L 27/32* (2006.01)
*H01L 29/786* (2006.01)
*H01L 29/417* (2006.01)
*H01L 29/423* (2006.01)
(Continued)

(52) U.S. Cl.
CPC .... *H01L 27/3272* (2013.01); *H01L 29/41733* (2013.01); *H01L 29/42384* (2013.01); *H01L 29/45* (2013.01); *H01L 29/4908* (2013.01); *H01L 29/7869* (2013.01);
(Continued)

(58) Field of Classification Search
CPC .................. H01L 51/0545; H01L 31/036
See application file for complete search history.

(56) References Cited

U.S. PATENT DOCUMENTS 5,844,647 A 12/1998 Maruno et al.
2002/0036616 A1* 3/2002 Inoue ..................... 345/107
(Continued)

FOREIGN PATENT DOCUMENTS

CN 101794820 A 8/2010
CN 102593145 A 7/2012
(Continued)

OTHER PUBLICATIONS

PCT International Search Report for PCT/KR2013/012088, dated Apr. 22, 2014, 3 Pages.
(Continued)

*Primary Examiner* — Thao X Le
*Assistant Examiner* — Geoffrey Ida
(74) *Attorney, Agent, or Firm* — Fenwick & West LLP

(57) ABSTRACT

A thin film transistor, a method of manufacturing the thin film transistor, and a display device including the thin film transistor are provided. The thin film transistor comprises a gate electrode formed on the oxide semiconductor layer such that a first surface of the oxide semiconductor layer faces the gate electrode. A source electrode and a drain electrode are electrically connected to the oxide semiconductor layer, respectively. The oxide semiconductor layer, gate electrode, source electrode and drain electrode are arranged in a coplanar transistor configuration. A light-blocking element is also arranged to shield a second surface of the oxide semiconductor layer from external light.

33 Claims, 9 Drawing Sheets

(51) Int. Cl.
    *H01L 29/45* (2006.01)
    *H01L 29/49* (2006.01)
(52) U.S. Cl.
    CPC .. *H01L 29/78603* (2013.01); *H01L 29/78633* (2013.01); *H01L 29/78648* (2013.01); *H01L 31/036* (2013.01)

(56) References Cited

U.S. PATENT DOCUMENTS

| | | | |
|---|---|---|---|
| 2002/0163016 A1* | 11/2002 | Shibata | 257/200 |
| 2002/0197760 A1* | 12/2002 | Yamazaki | C23C 16/303 438/48 |
| 2004/0232495 A1* | 11/2004 | Saito et al. | 257/382 |
| 2005/0275038 A1 | 12/2005 | Shih et al. | |
| 2006/0246360 A1* | 11/2006 | Hwang | 430/5 |
| 2010/0181565 A1* | 7/2010 | Sakata et al. | 257/43 |
| 2010/0224872 A1 | 9/2010 | Kimura | |
| 2011/0297948 A1 | 12/2011 | Jeong et al. | |
| 2012/0098008 A1* | 4/2012 | Song et al. | 257/98 |
| 2012/0168756 A1 | 7/2012 | Ryu et al. | |
| 2012/0175615 A1 | 7/2012 | You et al. | |

FOREIGN PATENT DOCUMENTS

| | | |
|---|---|---|
| KR | 10-2004-0093792 A | 11/2004 |
| KR | 10-2012-0124316 A | 11/2012 |
| WO | WO 2011/104895 A1 | 9/2011 |
| WO | WO 2012/063436 A1 | 5/2012 |

OTHER PUBLICATIONS

Supplementary European Search Report for European Patent Application No. EP 13868517.7, dated Nov. 28, 2016, 11 Pages.
Office Action and Search Report for Chinese Patent Application No. 201380068063.4, dated Feb. 4, 2017, 17 Pages.

* cited by examiner

THIN-FILM TRANSISTOR, METHOD FOR MANUFACTURING THE SAME AND DISPLAY DEVICE COMPRISING THE SAME

CROSS-REFERENCE TO RELATED APPLICATION

This application claims priority to and the benefit of Korean Patent Application No. 10-2012-0155587, filed on Dec. 27, 2012, the disclosure of which is incorporated herein by reference in its entirety. This application also claims priority to and the benefit of Korean Patent Application No. 10-2013-0146139, filed on Nov. 28, 2013, the disclosure of which is incorporated herein by reference in its entirety.

BACKGROUND

1. Field of the Invention

The present invention relates to a thin film transistor (TFT), a method of manufacturing the same, and a display device including the thin film transistor, and more particularly, to a thin film transistor having a coplanar structure with improves optical reliability and characteristics thereof, a method of manufacturing the thin film transistor, and a display device including the thin film transistor.

2. Discussion of Related Art

As interest in information display has recently increased and demands for portable electronic devices have increased, lightweight thin flat panel display devices have been widely studied and commercialized. From among flat panel display devices, particularly, liquid crystal display (LCD) devices and organic light-emitting display (OLED) devices have been particularly widely studied. LCD devices and organic light-emitting display devices use a thin film transistor as a switching device and/or a driving device.

Thin-film transistors using an oxide semiconductor are classified into thin film transistors having a coplanar structure and thin film transistors having an inverted-staggered structure according to positions of an active layer, a gate electrode, a source electrode, and a drain electrode. A parasitic capacitance between a gate electrode and an active layer in a thin film transistor having an inverted-staggered structure is very high. Because of such high parasitic capacitance, it is difficult to apply the thin film transistor having the inverted-staggered structure to a large-scaled display device. Therefore, coplanar type thin film transistors are employed in large-scaled display devices.

The active layer of a thin film transistor can be formed of amorphous silicon, poly-silicon or an oxide semiconductor. When a thin film transistor using poly-silicon is manufactured, a process of implanting ions to adjust a resistance of an active layer is additionally performed. Accordingly, an ion implantation process using an additional mask for defining an ion implantation region is disadvantageously added.

On the other hand, a thin film transistor using an oxide semiconductor has higher electron mobility than a thin film transistor using amorphous silicon, and exhibit lower leakage current than the thin film transistor using the amorphous silicon or the poly-silicon, and satisfies a high reliability test condition. Also, the thin film transistor using the oxide semiconductor advantageously has a uniform distribution of threshold voltages when compared to the thin film transistor using the poly silicon.

Despite such excellent electric and optical characteristics, the oxide semiconductor based TFT has a few drawbacks. For instance, the oxide semiconductor based TFT, especially the inverted-staggered type, exhibits high parasitic capacitance between the gate electrode and the active layer, which makes it difficult to be employed in the TFT in large display panels. In addition, the oxide semiconductor based TFTs may exhibit hysteresis (i.e., threshold voltage shift) when the oxide semiconductor material is exposed to incident light during the operation.

Thus, there remains a need for oxide semiconductor technologies that can enhance the performance and operation stability of TFTs.

SUMMARY OF THE INVENTION

In an aspect, a thin film transistor having an improved coplanar structure is provided.

In one embodiment, the coplanar thin film transistor comprises an oxide semiconductor layer formed on a substrate. A gate electrode is formed on the oxide semiconductor layer. The oxide semiconductor layer has a first surface facing the gate electrode. A source electrode and a drain electrode are electrically connected to the oxide semiconductor layer, respectively, and a portion of at least one of the source electrode and the drain electrode covers a side of the oxide semiconductor layer. A stack of multiple buffer layers are disposed between the substrate and a third surface of the oxide semiconductor layer that is opposite from the first surface. The stack of buffer layers includes at least two buffer layers being adjacent to each other and having different refractive indices. The difference in the refractive indices between the two adjacent buffer layers defines a critical angle for refracting external light. The coplanar thin film transistor further includes a light shielding layer. The light shielding layer is disposed in between the stack of buffer layers. The light shielding layer within the plurality of buffer layers is arranged to cover a channel region of the oxide semiconductor layer such that the entire channel region is overlapped by the light shielding layer.

In one embodiment, a thin film transistor comprises an oxide semiconductor layer, a gate electrode, a source electrode and a drain electrode, which are arranged in a coplanar transistor configuration. The gate electrode is formed on the oxide semiconductor layer such that a first surface of the oxide semiconductor layer faces the gate electrode. The source electrode and the drain electrode are electrically connected to the oxide semiconductor layer, respectively. The thin film transistor further includes a light-blocking element that is arranged to shield a second surface (e.g. bottom or side surface) of the oxide semiconductor layer from external light.

The light-blocking element can be a light-shielding layer (e.g. metal) disposed within at least one buffer layer disposed between the flexible substrate and the second surface of the oxide semiconductor layer. In some embodiments, the light-shielding layer within at least one buffer layer may be arranged to cover a channel region of the oxide semiconductor layer such that the entire channel region is overlapped by the light shielding layer. In some other embodiments, the light shielding layer within at least one buffer layer may overlap the entire oxide semiconductor layer.

The light blocking element can be a plurality of buffer layers disposed between the flexible substrate and the second surface of the oxide semiconductor layer. The plurality of buffer layers includes at least two adjacent buffer layers (e.g., first and second buffer layers) with different refractive index from each other. Of the two adjacent buffer layers, the one being closer to the oxide semiconductor layer (e.g., second buffer layer) has lower refractive index than the other buffer layer (e.g., first buffer layer). The difference in the refractive indices of the buffer layers sets a critical angle for light refraction so that the external light entering in an incidence angle exceeding the critical angle is reflected off without reaching to the oxide semiconductor. An additional buffer layer (e.g., third buffer layer) may be disposed such that it is even closer to the oxide semiconductor layer than the two adjacent buffer layer. The refractive index of the third buffer layer may be even lower than the aforementioned two adjacent buffer layers (e.g., first and second buffer layers). In this setting, each of the three buffer layers in the order of being closer to the oxide semiconductor layer has a refractive index in the decreasing order. Also, the additional buffer layer positioned even closer to the oxide semiconductor layer than any of the aforementioned buffer layers may have higher refractive index than such buffer layers.

The light blocking element can also be a portion of the source or drain electrode that contacts a side surface of the oxide semiconductor and shields the side surface of the oxide semiconductor layer from the external light. The source or drain electrodes contacting the side surface of the oxide semiconductor may or may not contact the first surface of the semiconductor layer.

In one embodiment, a display device comprises a substrate, a coplanar thin film transistor, and a display element operative connected to the coplanar thin film transistor. The coplanar thin film transistor comprises an oxide semiconductor layer formed on the substrate; a gate electrode formed on the oxide semiconductor layer, a first surface of the oxide semiconductor layer facing the gate electrode; a source electrode and a drain electrode electrically connected to the oxide semiconductor layer, respectively, the oxide semiconductor layer, gate electrode, source electrode and drain electrode arranged in a coplanar transistor configuration; and a light-blocking element arranged to shield a second surface of the oxide semiconductor layer from external light.

In an embodiment, the display element is an organic light emitting element having an anode, a cathode and an organic light-emitting layer interposed between the anode and the cathode. The anode is electrically connected to the coplanar thin film transistor. In another embodiment, the display element is a liquid crystal display including a pixel electrode, a common electrode and a liquid crystal layer. In this embodiment, the pixel electrode is electrically connected to the coplanar thin film transistor. In another embodiment, the display element comprises a first electrode, a second electrode and an optical medium layer interposed between the first and second electrodes. The optical medium layer includes a fluid and charged particles dispersed in the fluid. The charged particles may have a variety of colors and optical characteristics (e.g., absorbing, reflecting, scattering, etc.). At least one of the first and second electrodes is electrically connected to the coplanar thin film transistor to control the movement of the charged particles.

Additional features of the invention will be set forth in the description, which follows, and in part will be apparent from the description, or may be learned by practice of the invention.

It is to be understood that both the foregoing general description and the following detailed description are exemplary and explanatory and are intended to provide further explanation of the invention as claimed.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings.

DETAILED DESCRIPTION OF EXEMPLARY EMBODIMENTS

The following detailed description is made with reference to the figures. Exemplary embodiments are described to illustrate the claimed invention, not to limit its scope, which is defined by the appended claims. Throughout the present disclosure, it should be appreciated that references to an element formed "on" a layer are interpreted as an element formed directly on the referenced layer as well as the configuration in which an extra element is formed between the element and the referenced layer. Also, it should be appreciated that references to "one embodiment," "an embodiment," "some embodiments," are the likes are not intended to be interpreted as excluding the existence of additional embodiments that also incorporate the disclosed features.

Dimensions of the embodiments depicted in the figures are scaled for clearer explanation, and it should be appreciated that the embodiments are not limited the disclosed dimensions.

Figure 1A:
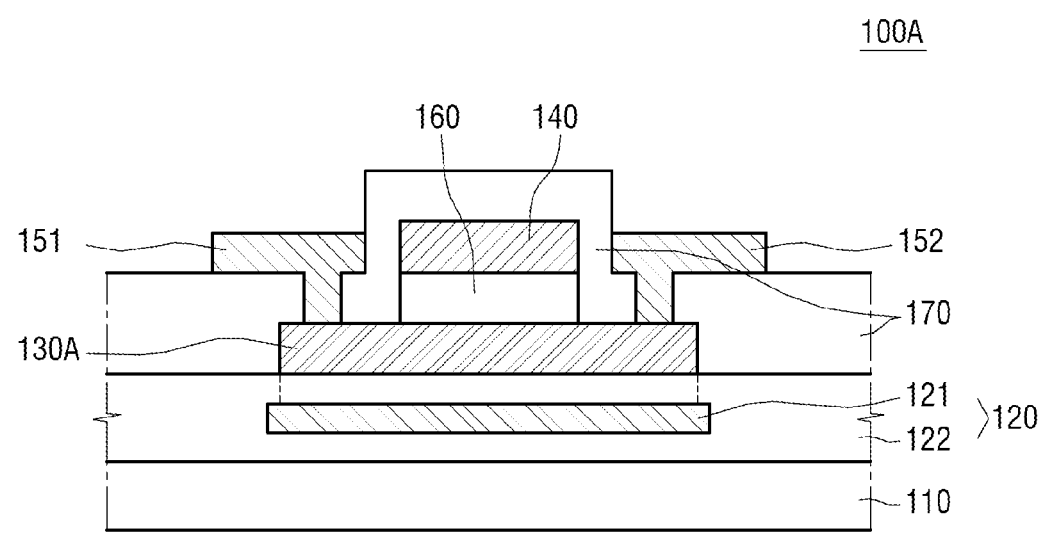
FIG. 1A is a cross-sectional view illustrating a thin film transistor (TFT) according to an embodiment of the present invention.

FIG. 1A is a cross-sectional view illustrating a thin film transistor (TFT) 100A according to an embodiment of the present invention. Referring to FIG. 1A, the thin film transistor 100A includes a flexible substrate 110, a buffer layer 120, an active layer 130A, a gate insulating film 160, a gate electrode 140, an interlayer insulating film 170, a source electrode 151, and a drain electrode 152.

The flexible substrate 110 is a substrate for supporting and protecting various elements that may be formed thereon. The flexible substrate 110 is a lower support plate located in a bottom of the thin film transistor 100A. The flexible substrate 110 may be formed of various materials according to various applications using the thin film transistor 100A. For example, when the thin film transistor 100A is used in a flexible application such as a flexible display device, the flexible substrate 110 may be formed of a flexible insulating material. Examples of the flexible insulating material may include polyimide (PI), polyetherimide (PEI), polyethylene terephthalate (PET), polycarbonate (PC), polystyrene (PS), styrene acrylonitrile copolymer, and silicon-acrylic resin. Also, when the thin film transistor 100A is used in an application having a high transmittance such as a transparent display device, the flexible substrate 110 may be formed of a flexible transparent insulating material.

An active layer 130A, which is formed of an oxide semiconductor, is formed on the flexible substrate 110. In the present disclosure, the active layer 130A may be referred to as an oxide semiconductor layer. The active layer 130A may be formed by depositing an oxide semiconductor material on the flexible substrate 110 and then patterning the oxide semiconductor material to leave only an oxide semiconductor having a size enough to form the active layer 130A.

The oxide semiconductor of the active layer 130A may be various metal oxides. For example, examples of a material for the oxide semiconductor may include a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an indium aluminum zinc oxide (InAlZnO)-based material, an indium hafnium zinc oxide (InHfZnO), a tin gallium zinc oxide (SnGaZnO)-based material, an aluminum gallium zinc oxide (AlGaZnO)-based material, or a tin aluminum zinc oxide (SnAlZnO)-based material, and a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium gallium oxide (InGaO)-based material, an indium oxide (InO)-based material, a tin oxide (SnO)-based material, or a zinc oxide (ZnO)-based material. A composition ratio of elements included in each of the materials used to form the oxide semiconductor is not limited and may be variously adjusted.

The thin film transistor 100A includes a gate electrode 140, which is formed to overlap at least a portion of the active layer 130A. The gate electrode 140 is formed of a conductive material. In some embodiments, the gate electrode 140 may be formed of a metal, and may reflect light. The gate electrode 140 may be formed of any one of, for example, molybdenum (Mo), aluminum (Al), chromium (Cr), gold (Au), titanium (Ti), nickel (Ni), neodymium (Nd), copper (Cu), and an alloy thereof. However, the present embodiment is not limited thereto, and the gate electrode 140 may be formed of any of various materials. Also, the gate electrode 140 may have a multi-layered structure including a material selected from the group consisting of Mo, Al, Cr, Au, Ti, Ni, Nd, Cu, and an alloy thereof.

The thin film transistor 100A further includes a source electrode 151 and a drain electrode 152. Each of the source electrode 151 and the drain electrode 152 may be formed of a conductive material. In some embodiments, each of the source electrode 151 and the drain electrode 152 may be formed of a metal, and may reflect light. Each of the source electrode 151 and the drain electrode 152 may be formed of any one of, for example, Mo, Al, Cr, Au, Ti, Ni, Nd, Cu, and an alloy thereof. However, the present embodiment is not limited thereto, and each of the source electrode 151 and the drain electrode 152 may be formed of various materials. Also, each of the source electrode 151 and the drain electrode 152 may have a multi-layered structure including a material selected from the group consisting of Mo, Al, Cr, Au, Ti, Ni, Nd, Cu, and an alloy thereof.

The source electrode 151 and the drain electrode 152 are electrically connected to the source region and the drain region of the active layer 130A, respectively, through the contact holes formed in the interlayer insulating film 170 and/or the gate insulating film 160. An upper channel region is formed between the source region and the drain region of the active layer 130A. The upper channel region is formed in an upper portion of the active layer 130A adjacent to the gate electrode 140.

The source electrode 151, the drain electrode 152, and the gate electrode 140 cover a top surface of the active layer 130A including the oxide semiconductor. Since each of the source electrode 151, the drain electrode 152, and the gate electrode 140 may be formed of a metal and may reflect light as described above, the source electrode 151, the drain electrode 152, and the gate electrode 140 protect the active layer 130A from external light incident on the active layer 130A. In particular, since materials used for a substrate that supports the thin film transistor 100A are generally transparent materials, external light may be incident from the bottom of the active layer 130A. In addition, when the thin film transistor 100A employed in a bottom emission organic light-emitting display (OLED) device, the light emitted from an organic emission layer can reach the thin film transistor 100A, and thus the reliability of the thin film transistor 100A may be reduced. Also, when the thin film transistor 100A is applied to a liquid crystal display (LCD) device using a separate backlight unit, the reliability of the thin film transistor 100A may be reduced due to light incident on the active layer 130A from the backlight unit. For simpler explanation, the term "external light" is used in the present disclosure to refer any light incident on the active layer 130A, irrespective of the source or the direction of the light from the source.

Various insulating materials and/or layers are used to electrically insulate the elements of the thin film transistor 100A. The gate insulating film 160 is formed on the active layer 130A, and insulates the active layer 130A and the gate electrode 140. The gate insulating film 160 may be formed of a single layer of a silicon oxide film or a silicon nitride film, or a multiple-layered structure thereof. However, the present embodiment is not limited thereto and the gate insulating film 160 may be formed of various materials. The gate insulating film 160 only needs to insulate the active layer 130A and the gate electrode 140. Accordingly, in FIG. 1A, the gate insulating film 160 is formed only on the active layer 130A. Alternatively, the gate insulating film 160 may be formed over the entire flexible substrate 110 including the active layer 130A. When the gate insulating film 160 is formed over the entire flexible substrate 110, the gate insulating film 160 may be formed to have contact holes through which portions of the active layer 130A are exposed, and the contact holes may expose a portion of the source region and a portion of the drain region of the active layer 130A.

In FIG. 1A, the gate electrode 140 is illustrated as having substantially the same size with the gate insulating film 160. That is, the contacting surface of the gate electrode 140 and the contacting surface of the gate insulating film 160 interfacing each other have the substantially the same size. In the present disclosure, the two elements are said to have "substantially the same size" even when the two elements do not have the exact same size caused by fabrication process (i.e., deviation due to the fabrication process). For instance, either the gate electrode 140 or the gate insulating film 160 may be formed slightly larger than the other element due to being over-etched during the fabrication process. In such a case, the gate electrode 140 and the gate insulating film 160 may be formed to have a tapered shape such that the surface of the gate electrode 140 and the surface of gate insulating film 160 at the interface have slightly different sizes.

The interlayer insulating film 170 is formed on the gate electrode 140. The interlayer insulating film 170 may be formed of the same material as that of the gate insulating film 160, and may be formed to include a silicon oxide film, a silicon nitride film, or a multi-layer structure thereof. However, the present embodiment is not limited thereto, and the interlayer insulating film 170 may be formed of various materials. The interlayer insulating film 170 is formed over the entire flexible substrate 110, and includes contact holes for exposing a portion of the source region and a portion of the drain region of the active layer 130A.

The buffer layer 120 is formed on the flexible substrate 110. The buffer layer 120 is formed between the flexible substrate 110 and the active layer 130A. The buffer layer 120 reduces permeation of moisture or other impurities through the flexible substrate 110, and further, planarizes the surface of the flexible substrate 110. The buffer layer 120 includes a reflective metal layer 121 and an insulating layer 122. A material for the insulating layer 122 may be selected according to a type of the flexible substrate 110 or a type of the thin film transistor 100A. For example, the insulating layer 122 may be selected according to interfacial characteristics between the insulating layer 122 and the active layer 130A according to a structure of the thin film transistor 100A. In the thin film transistor 100A having the coplanar structure as shown in FIG. 1A, the insulating layer 122 may be formed of a silicon oxide film, a silicon nitride film, or a multi-layered structure thereof.

The buffer layer 120 protects the oxide semiconductor that constitutes the active layer 130A by hindering the progress of external light towards the oxide semiconductor. The reflective metal layer 121 is disposed in the buffer layer 120, and surrounded by the insulating layer 122. Since the reflective metal layer 121 blocks the external light, the reflective metal layer 121 may be referred to as a shielding layer or a light-shielding layer. While the external light projecting perpendicular to the oxide semiconductor can be reflected by the reflective metal layer 121, light projected in some other angle may still reach the oxide semiconductor. In order to optimize blocking of the external light projecting towards the active layer 130A, the distance between the active layer 130A and the reflective metal layer 121 may be equal to or less than 3 µm.

When light is incident on the active layer 130A while bias voltage is applied to the thin film transistor 100A, pairs of electrons and holes are broken in the active layer 130A to generate electrons in a channel region. This changes the operating characteristics of the oxide semiconductor. For example, the electrons may be generated in the channel region and causes the threshold voltage Vth of the thin film transistor 100A to fluctuate, thereby making the thin film transistor 100A unreliable for its intended use.

Referring to FIG. 1A, in the thin film transistor 100A, the reflective metal layer 121 is disposed to overlap the active layer 130A, and the size of the reflective metal layer 121 may be equal to or greater than that of the active layer 130A such that the reflective metal layer 121 entirely overlaps the active layer 130A. More specifically, the size of the reflective metal layer 121 can be equal to or greater than the channel region defined by the gate electrode 140. Accordingly, the reflective metal layer 121 may shield active layer 130A from the external light, along with the gate electrode 140, the source electrode 151, and the drain electrode 152. In particular, the reflective metal layer 121 serves to block external light incident from the bottom of the active layer 130A, thereby shielding the bottom surface of the active layer 130A.

Figure 1B:
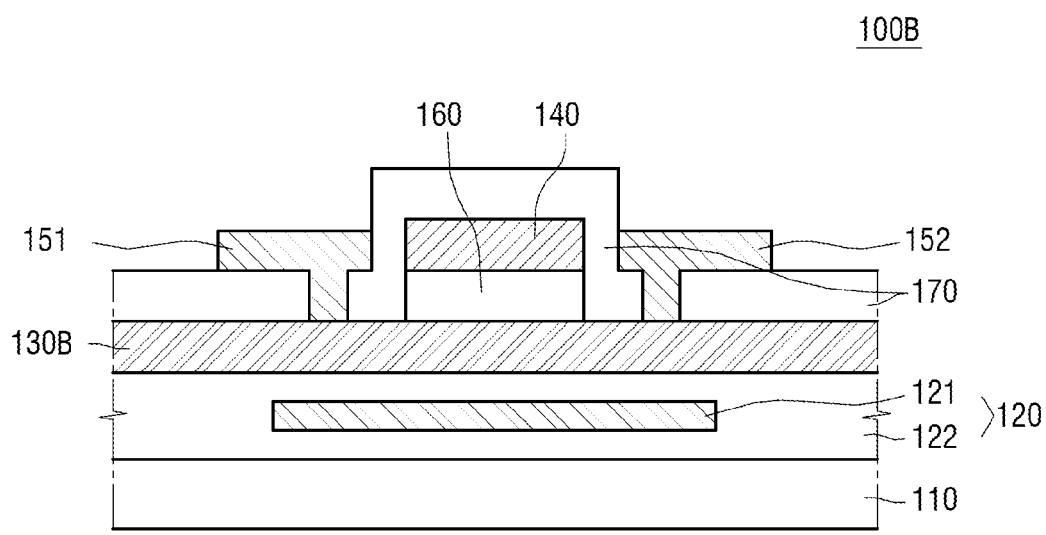
FIG. 1B is a cross-sectional view illustrating a thin film transistor 100B according to another embodiment of the present invention.

FIG. 1B is a cross-sectional view illustrating a thin film transistor 100B according to another embodiment of the present invention. In FIGS. 1A and 1B, elements denoted by the same reference numerals with different English alphabets are substantially the same, and thus a repeated explanation thereof will not be given.

An active layer 130B is formed on a buffer layer 120 such that the active layer 130B is formed over the entire buffer layer 120. The active layer may be formed by depositing an oxide semiconductor material on the buffer layer 120 and then patterning the oxide semiconductor material to leave only an oxide semiconductor having a size enough to form the active layer. This process, however, requires an additional mask process for patterning the oxide semiconductor material, complicating the manufacturing process and increasing the production costs. In the thin film transistor 100B illustrated in FIG. 1B, however, the active layer 130B is formed over the entire buffer layer 120. In this setting, the aforementioned mask process is not needed, and thus simplifies the overall fabrication process and reduces the production cost of the thin film transistor. Further, with the reduced tact time, manufacturing yield may also improve.

A reflective metal layer 121 of the buffer layer 120 may completely overlap at least a portion of the gate electrode 140. In the example shown in FIG. 1B, the reflective metal layer 121 is formed to be larger than the gate electrode 140, and thus overlaps the channel region defined by gate electrode 140. However, the reliability of the thin film transistor 100B can be maintained so long as the channel region of the active layer 130B is shielded from the external light. Accordingly, the size of the reflective metal layer 121 can vary depending on the size of the channel region as well as the vertical distance between the reflective metal layer 121 and the active layer 130B.

Figure 2A:
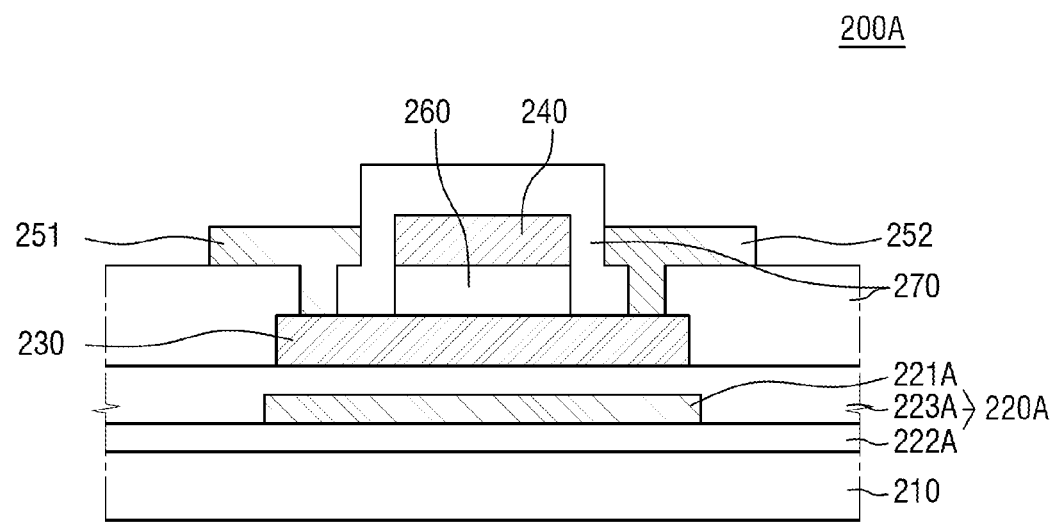
FIGS. 2A through 2C are pictorial representations (through a cross sectional view) depicting an exemplary thin film transistors according to embodiments of the present invention.

In some embodiments, the thin film transistor includes a plurality of insulating layers with different refractive indices to shield the oxide semiconductor from the external light. As shown in FIG. 2A, a buffer layer 220A includes a first insulating layer 222A, a reflective metal layer 221A, and a second insulating layer 223A, which are sequentially disposed between the flexible substrate 210 and the active layer 230. In addition to reducing permeation of light, the difference between the refractive indices of the first insulating layer 222A and the second insulating layer 223A causes the external light entering from the bottom of the flexible substrate 210 to be reflected at the interface of the first and the second insulating layers (222A, 223A).

In the exemplary thin film transistor 200A, the reflective metal layer 221A is configured to protect the active layer 230 from the external light incident from the bottom of the flexible substrate 210 at the region where the reflective meal layer 221A overlaps the active layer 230. In the non-overlapping region, the multi-layered buffer layer 220A including the first insulating layer 222A and the second insulating layer 223A protects the active layer 230 from external light projected in an angle towards the active layer 230.

When light moves from a medium having a high refractive index to a medium having a low refractive index, light incident at an incident angle greater than a critical angle at an interface between the media does not pass through the interface between the media and is totally reflected. For example, the first insulating layer 222A may be a silicon nitride film having a refractive index of 1.8, and the second insulating layer 223A may be a silicon oxide film having a refractive index of 1.45. Accordingly, the light traveling through the insulating layers (222A, 223A) at an incident angle greater than the critical angle cannot pass through buffer layer 220A due to the total internal reflection at the interface between the first insulating layer 222A and the second insulating layer 223A.

Figure 2B:
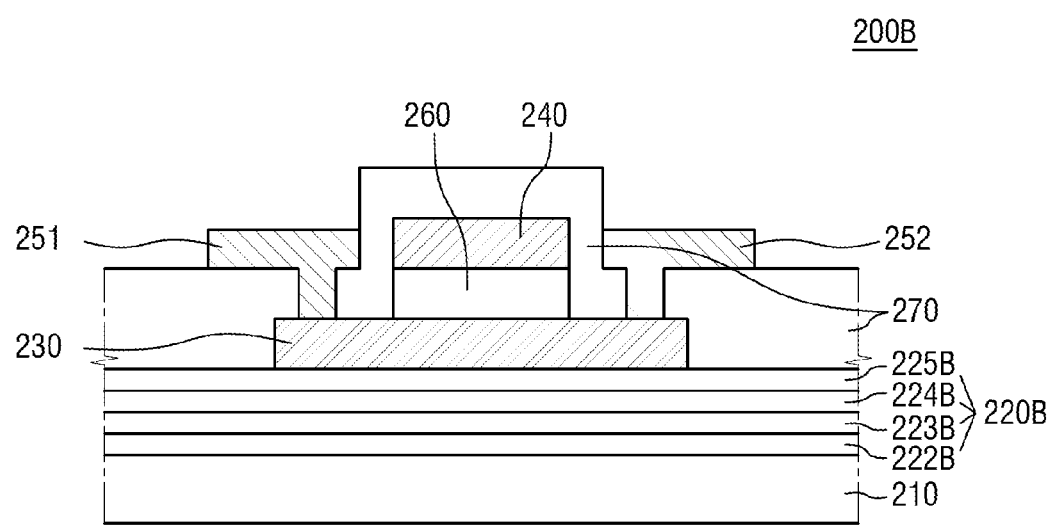

An increase in the total internal reflection of light within the buffer layer can be obtained by providing additional number of insulating layers with different refractive indices. Depending on the total number of insulation layers and the difference between their refractive indices, the stability of the thin film transistor can be maintained even without employing the reflective metal layer. The buffer layer 220B of the exemplary embodiment shown in FIG. 2B is formed with a stack of four insulation layers. The first insulating layer 222B and the third insulating layer 224B can be formed to have the same refractive index, while the second insulating layer 223B and the fourth insulating layer 225B have the same refractive index. For instance, the first insulating layer 222B and the third insulating layer 224B may be formed of silicon nitride having refractive indices of 1.8, while the second insulating layer 223B and the fourth insulating layer 225B may be formed of silicon oxide having refractive indices of 1.45. The materials for forming the insulating layers and the stacking order of the insulating layers are not limited by this example. As such, the materials for forming each of the insulating layers can be selected from a variety of materials, and the insulating layers can be arranged so that more total internal reflection of the external light occurs at the interfaces between the two adjacent insulating layers. For example, the insulation layer of the buffer layer 230 may be disposed on the substrate 210 in the order of their refractive index so that the insulation layer with higher refractive index is formed closer to the source of external light and the insulation layer with lower refractive index is formed closer to the active layer 230.

Figure 2C:
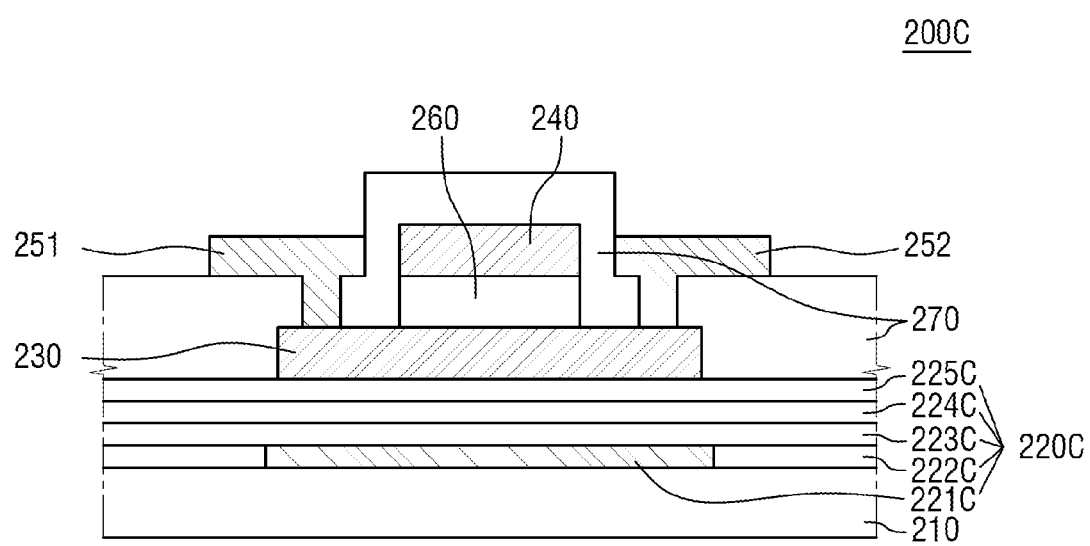

In one embodiment, the reflective metal layer described above can be used in conjunction with the stack of insulating layers to further enhance the protection afforded by the buffer layer. In FIG. 2C, the reflective metal layer 221C is illustrated as being formed directly on the substrate 210 or within the first insulating layer 222C, and additional insulating layers (e.g., second, third and fourth insulation layers 223C, 224C, 225C) are disposed on the reflective metal layer 221C and the first insulating layer 222C. As previously discussed, the amount of light reaching the active layer 230 can vary based on the distance between the reflective metal layer 221C and the active layer 230. Similarly, the reflective metal layer 221C may be disposed on or within other insulation layers, which may be closer to or farther away from the active layer 230 by considering a variety of factors including, but are not limited to, the size of the channel region in the active layer 230, the angle of light projected from the light source and/or difference of refractive indices between the insulation layers.

Figure 3A:
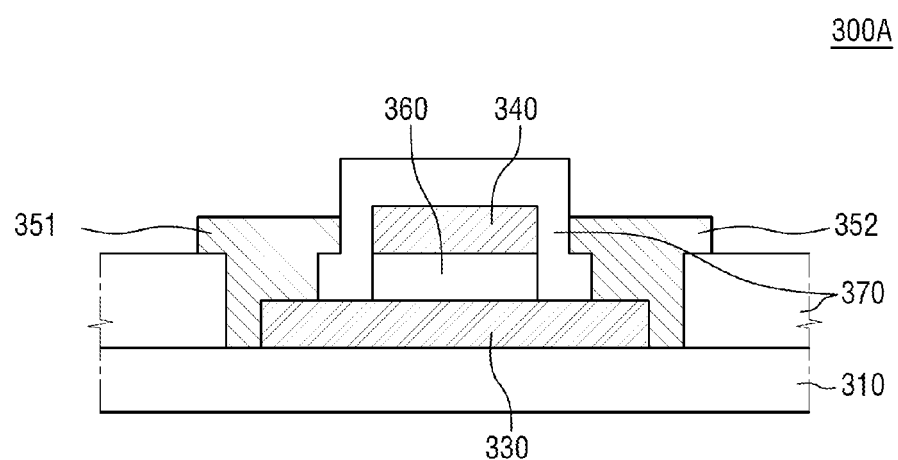
FIGS. 3A and 3B are pictorial representations (through a cross sectional view) depicting an exemplary thin film transistors according to embodiments of the present invention.

FIG. 3A is a cross-sectional view illustrating a thin film transistor 300A according to another embodiment of the present invention. A flexible substrate 310, an active layer 330, a gate insulating film 360, and a gate electrode 340 of FIG. 3A are substantially the same as the flexible substrate 110, the active layer 130A, the gate insulating film 160, and the gate electrode 140 of FIG. 1A.

An interlayer insulating film 370 is formed on the gate electrode 340. The interlayer insulating film 370 may be formed of the same material as that of the gate insulating film 360, for example, silicon oxide, silicon nitride and the likes. Likewise, the interlayer insulating film 370 may be formed as a stack of layers that are formed of such materials. The interlayer insulating film 370 may be formed over the entire flexible substrate 310, and include contact holes that expose some portions of the active layer 330. As illustrated in FIG. 3A, the contact holes can be formed to expose at least a portion of each side surface of the active layer 330. Additionally, the contact holes may further expose at least portions of the upper surface of the active layer 330. Otherwise, the interlayer insulating film 370 is substantially the same as the interlayer insulating film 170 of FIG. 1A.

The source electrode 351 and the drain electrode 352 are formed on the interlayer insulating film 370. The source electrode 351 and the drain electrode 352 may be electrically connected to a source region and a drain region of the active layer 330 through the contact holes formed in the interlayer insulating film 370 and/or the gate insulating film 360. Accordingly, the source electrode 351 and the drain electrode 352 contact at least portions of the side surface of the active layer 330, and additionally contact at least portions of the upper surface of the active layer 330. In this setting, the contact surface areas between the active layer 330 and the source electrode 351 and between the active layer 330 and the drain electrode 352 are increased, thereby reducing the resistances between the active layer 330, and the source electrode 351 and the drain electrode 352. In addition, due to the aforementioned configuration, the source electrode 351 and the drain electrode 352 can be utilized to protect the active layer 330 from the external light incident from the side surface and the upper surface of the active layer 330. Otherwise, the source electrode 351 and the drain electrode 352 are substantially the same as the source electrode 131 and the drain electrode 132 of FIG. 1A.

Figure 3B:
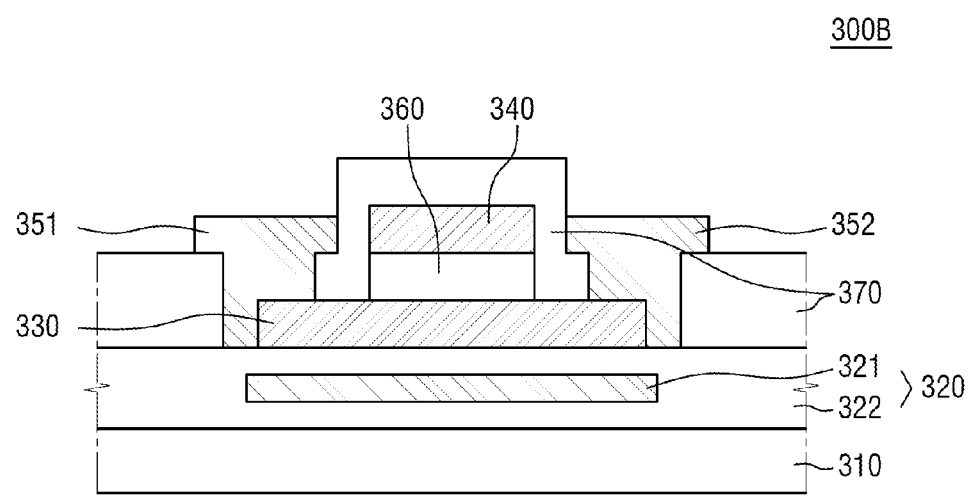

FIG. 3B is a cross-sectional view illustrating a thin film transistor 300B which has been modified from the thin film transistor 300A. Namely, a buffer layer 320, which includes a reflective metal layer 321 and an insulating layer 322, exists between the substrate 310 and the active layer 330. Accordingly, due to the aforementioned configuration, the reflective metal layer 321 can be utilized to additionally protect the active layer 330 from the external light incident from the bottom surface of the active layer 330.

Figure 4A:
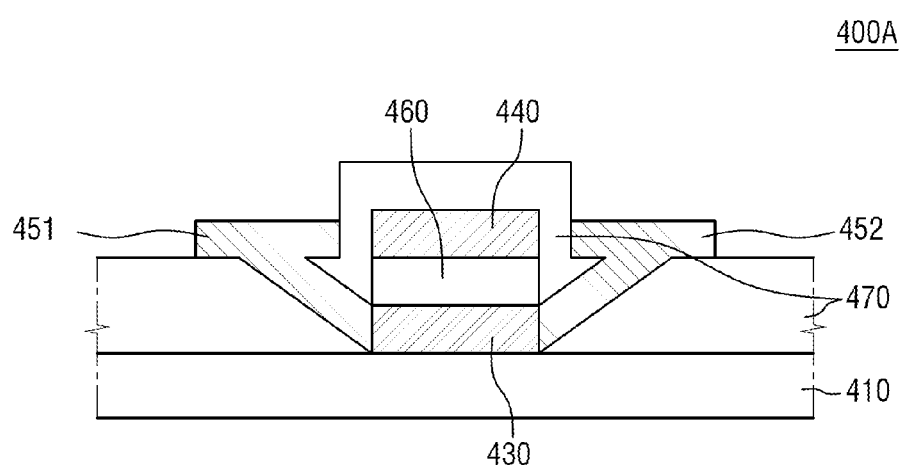
FIGS. 4A and 4B are pictorial representations (through a cross sectional view) depicting an exemplary thin film transistors according to embodiments of the present invention.

FIG. 4A is a cross-sectional view illustrating a thin film transistor 400A which has been modified from the thin film transistor 300A of FIG. 3A. Namely, the contact holes formed through the interlayer insulating film 470 and/or gate insulating film 460 have a different configuration from the contact holes of FIG. 3A. The contact holes are angled (i.e. sloped and not perpendicular to the substrate 410) towards the active layer 430 such that only the side surfaces of the active layer 430 are exposed. By employing such angled contact holes, the fabrication of the active layer 430, the gate insulating film 460 and the gate electrode 440 can be simplified. For example, the number of masks used in fabricating the thin film transistor 400A can be reduced in comparison to that of the thin film transistor 300A in FIG. 3A.

Accordingly, due to the aforementioned configuration, the source and drain electrodes 451, 452 formed in the angled contact holes can be utilized to protect the active layer 430 from the external light incident from the side surface of the active layer 430. Additionally, due to the shape of the contact holes, the gate electrode 440 is substantially the same size as the active layer 430.

Figure 4B:
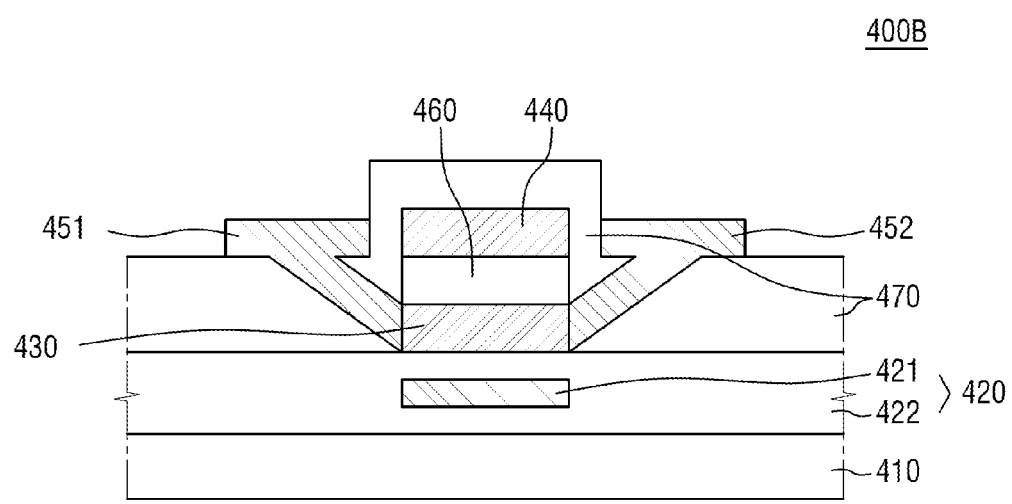

FIG. 4B is a cross-sectional view illustrating a thin film transistor 400B which has been modified from the thin film transistor 400A. Namely, a buffer layer 420, which includes a reflective metal layer 421 and an insulating layer 422, exists between the substrate 410 and the active layer 430. Accordingly, due to the aforementioned configuration, the reflective metal layer 421 can be utilized to additionally protect the active layer 430 from the external light incident from the bottom surface of the active layer 430.

Figure 5:
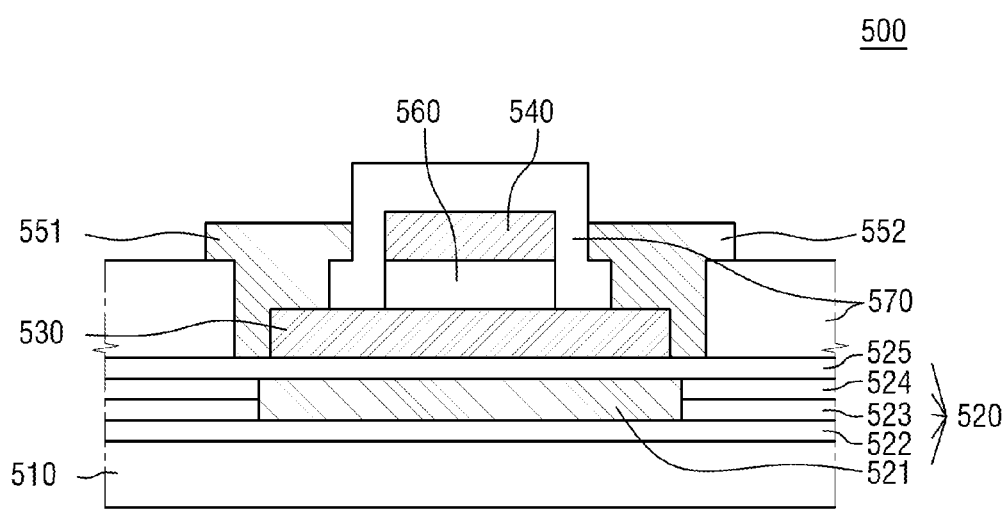
FIG. 5 is a cross-sectional view illustrating a thin film transistor, which combines the features of other embodiments.

FIG. 5 is a cross-sectional view illustrating a thin film transistor 500, which combines the features of certain embodiments described above. The thin film transistor 500 includes various light blocking elements (e.g. buffer layers 520, reflective metal layer 521, source/drain electrodes 551,552) to shield the bottom and side surfaces of the active layer 530 from light. That is, the thin film transistor 500 employs the buffer layer 520 including the reflective metal layer 521, and also employs source/drain electrodes (551, 552) that cover the side surfaces of the active layer 530 to maintain the stability of the thin film transistor 500. The reflective metal layer 521 protects the bottom surface of the active layer 530 from the external light. The stack of insulating layers (522, 523, 524, 525) in the buffer layer 520 have different refractive indices and thus reflects the light projected towards the active layer 530 at an angle greater than the critical angle. The source/drain electrodes (551, 552) shield the active layer 530 from the external light incident from the side. The use of different types of light blocking elements thus provides a high degree of protection against external light.

Figure 6:
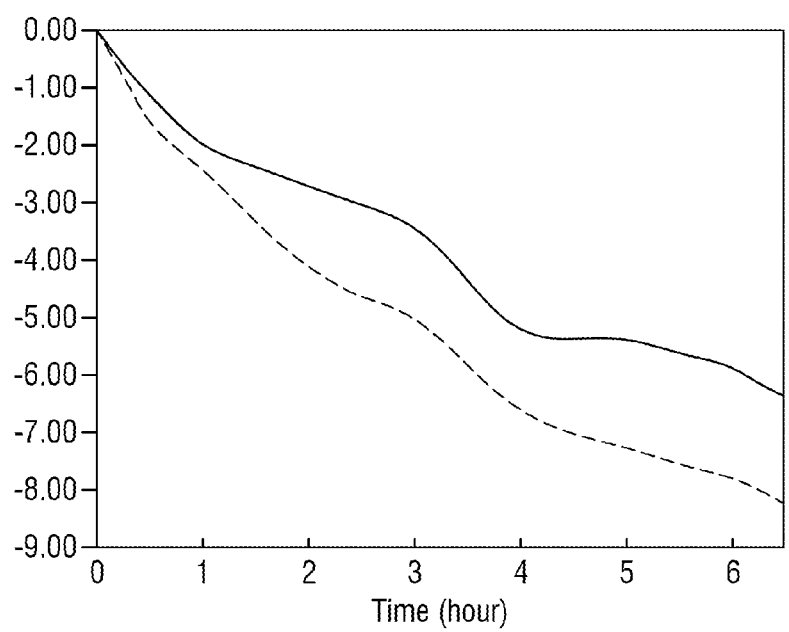
FIG. 6 is a graph for explaining the light reliability of a thin film transistor, according to an embodiment of the present invention.

FIG. 6 is a graph for explaining the light reliability of a thin film transistor that employs some of the features described above. In particular, the graph of FIG. 6 represents the relationship between the changes in threshold voltage and the light exposure time of the thin film transistor. The dashed line represents the changes in the threshold voltage of a thin film transistor, which does not use the buffer layer described in the present disclosure. The solid line represents the changes in the threshold voltage of a thin film transistor, which uses the buffer layer including a plurality of insulation layers with difference refractive indices. As shown in the graph, it is found that the decrease in the threshold voltage of the thin film transistor in a given time is significantly lower in the thin film transistor utilizing the plurality of insulating layers than the thin film transistor without the insulating layers. Referring to FIG. 6, at six hours of the light exposure time, the changes in the threshold voltage was found to be −6.00 when a plurality of insulation layers is used. In contrast, at six hours of the light exposure time, the changes in the threshold voltage were found to be −8.00 when a plurality of insulation layers is not used. Accordingly, such difference in the changes in the threshold voltage denotes that the negative bias illumination thermal stress (NBITS) is improved about 25% in comparison to the case where the buffer layer is not formed with the plurality of insulation layers. When the reflective metal layer is additionally used, the NBITS can be additionally improved.

Figure 7A:
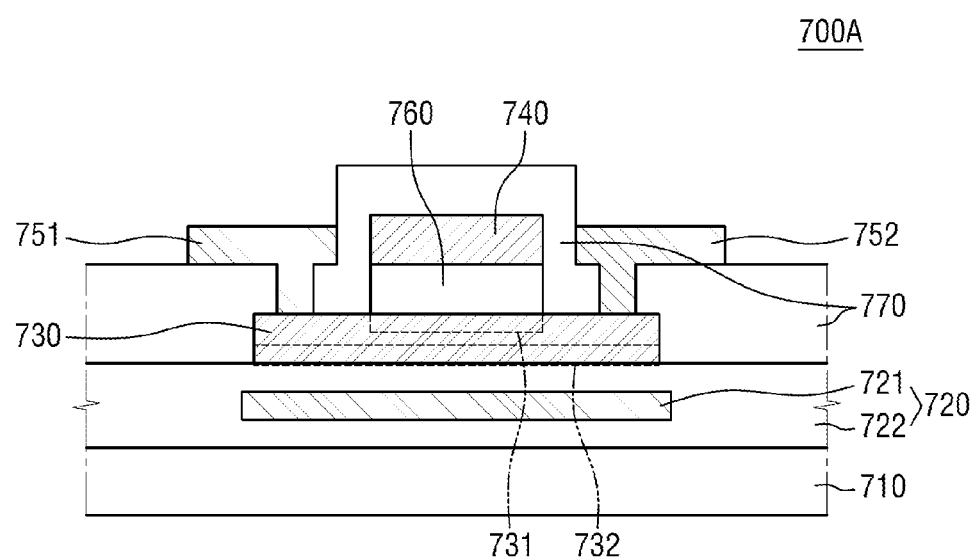
FIGS. 7A and 7B are cross-sectional views illustrating a thin film transistor according to an embodiment of the present invention.
Figure 7B:
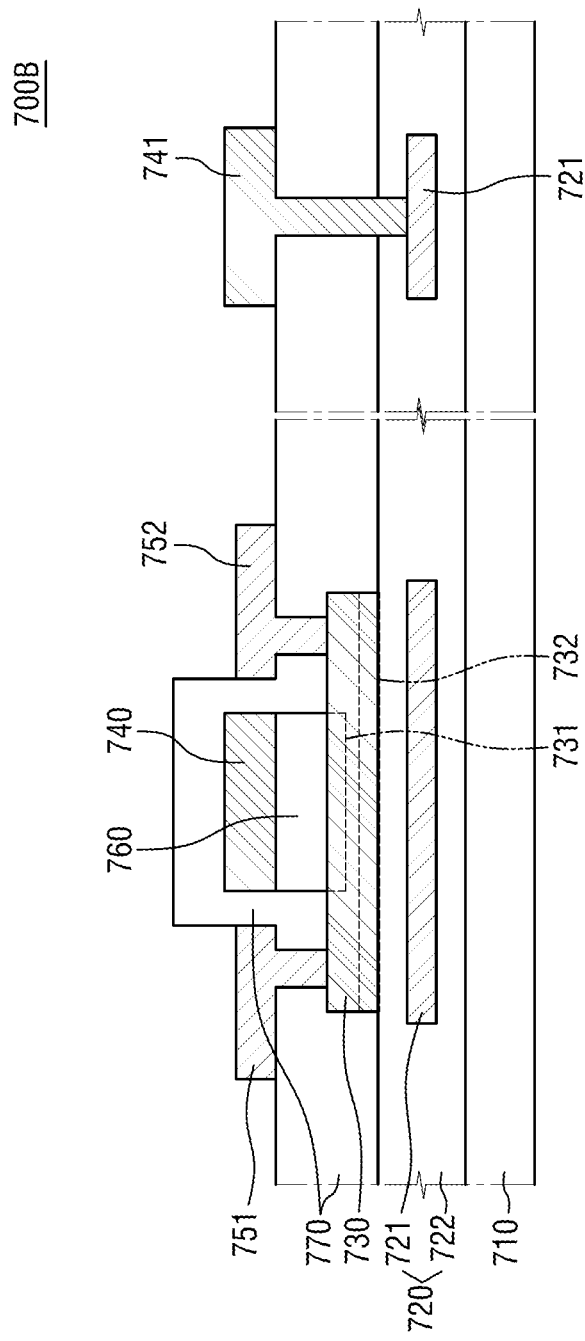

FIGS. 7A and 7B are cross-sectional views illustrating a thin film transistor 700A, 700B according to an embodiment of the present invention. A flexible substrate 710, a buffer layer 720, an active layer 730, a gate insulating film 760, a gate electrode 740, an interlayer insulating film 770, a source electrode 751, and a drain electrode 752 of FIGS. 7A and 7B are substantially the same as those of FIG. 1A.

The reflective metal layer 721 causes an additional channel region to be formed at the lower portion of the active layer 730. In order to provide the additional channel region, a reflective metal layer 721 included in the buffer layer 720 is electrically connected to the gate electrode 740. Such structure may be referred to as a dual gate structure.

Accordingly, when the gate electrode 740 and reflective metal layer 721 are commonly addressable, the same voltage can be applied to the gate electrode 740 and the reflective metal layer 721. In detail, when a voltage is applied to the gate electrode 740 and the reflective metal layer 721, charges are accumulated at the interface between the active layer 730 and the gate insulating film 760 to form an upper channel region 731, and charges are accumulated at the interface between the active layer 730 and the insulating layer 722 of the buffer layer 720 to form a lower channel region 732. When using the reflective metal layer 721 for forming the lower channel region 732, the reflective metal layer 721 and the active layer 730 should be spaced apart by a predetermined distance that is sufficient to form the lower channel region 732. For example, the distance between the reflective metal layer 721 and the active layer 730 may range from 500 Å to 2000 Å. It should be noted that the distance between the reflective metal layer 721 and the active layer 730 may be greater (e.g., 3 microns) if the reflective metal layer 721 is only used for the purpose of shielding light without having to provide a lower channel region 732 for the dual gate structure.

Since an area where charges may move in the thin film transistor 700A having a dual gate structure is greater than an area in a thin film transistor having a single gate structure, a channel resistance of the thin film transistor 700A, that is, a resistance between the active layer 730, and the source electrode 751 and the drain electrode 752 may be reduced. Because the upper channel region 731 and the lower channel region 732 are formed on both surfaces of the active layer 730, the mobility, the off-current Ioff (i.e., reduced) and the on-current Ion (i.e., increased) characteristics of the thin film transistor 700A can be improved. In addition, if the reflective metal layer 721 is configured as an individually addressable gate electrode (i.e., separate from the gate electrode 740) the threshold voltage Vth of the thin film transistor 700A can be easily adjusted to a desired level by adjusting a magnitude of a bias voltage.

Referring to FIG. 7B, the gate electrode 740 is branched out from a gate line 741 electrically connected to a pad unit (not shown) for receiving a variety of signals for controlling the thin film transistor 700B. The reflective metal layer 721 is electrically connected to at least a portion of the gate line 741 via a contact hole formed through the buffer layer 720 and/or the interlayer insulating film 770.

Thin film transistors according to various embodiments of the present invention may be used in various applications. For example, the thin film transistors may be used in various display devices having different types of display elements operatively connected to and controlled by thin film transistors. Examples of such display devices are an organic light-emitting display device, an LCD device and an electric paper display (EPD) device. As for the OLED device, each sub pixel typically employs a switching transistor and a driving transistor. The switching transistor transfers a data signal to the driving transistor, which controls the organic emission layer to emit light at a pixel or sub pixel. The OLED device may further include a thin film transistor for a compensation circuit that prevents an abnormal operation of the OLED device. Any one of these thin film transistors in the OLED device may be any of the exemplary thin film transistors described in the present disclosure. Also, the LCD device includes a plurality of pixel regions, and includes a plurality of thin film transistors for independently driving the plurality of pixel regions, and the plurality of thin film transistors used in the LCD device may also be any of the exemplary thin film transistors described in the present disclosure. The EPD device includes a lower substrate, an upper substrate, a pixel electrode, a common electrode, and an optical medium layer. The optical medium layer is disposed between the upper substrate and the lower substrate, and includes a fluid and color charged particles dispersed in the fluid. The EPD device includes a plurality of thin film transistors for independently driving the plurality of pixel regions. When using the thin film transistors described herein, the operating stability and performance of the OLED, LCD or EPD device can be improved.

Such devices may be implemented as a transparent display device. In order to show the object behind the display device, the external light must be able to pass through the display device to some extent, and may degrade the stability of a thin film transistor using the oxide semiconductor. As such, the thin film transistor described in the present disclosure can be employed in the transparent display device to maintain the operation stability of the device.

Figure 8:
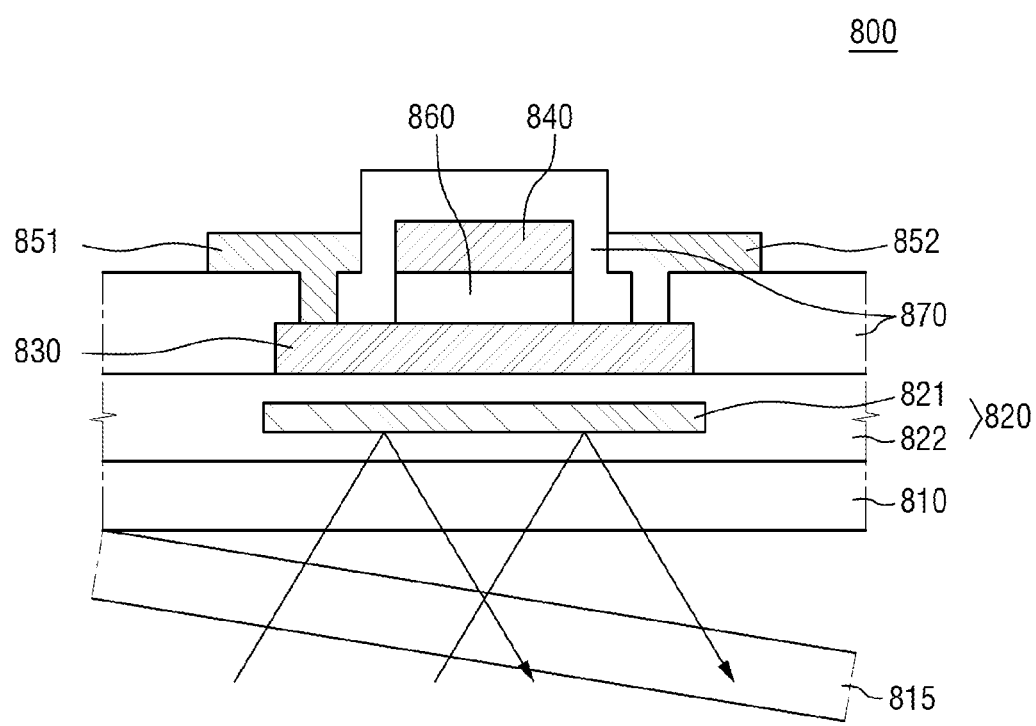
FIG. 8 illustrates manufacturing a device including a thin film transistor, according to an embodiment of the present invention.

Referring to FIG. 8, the thin film transistors 800 shown in embodiments described above formed on a flexible substrate 810 may be supported by a support substrate 815 used as a temporary base for supporting and protecting the flexible substrate 810 during the fabrication process. Such support substrate 815 needs to be removed or released. During the removal or release process, the active layer 830 may be subjected to external light. However, because of the reflective metal layer 821 and/or one or more insulation layers according to the embodiments described herein, the active layer 830 is protected from such external light during the removal or release process.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different from those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. As such, it should be reminded that any disclaimer made in the instant application should not be read into or against the parent application.

What is claimed is:

1. A thin film transistor comprising:
an oxide semiconductor layer on a flexible substrate and having a channel in a surface of the oxide semiconductor layer;
a first gate electrode formed on the oxide semiconductor layer, a first surface of the oxide semiconductor layer facing the first gate electrode;
an insulating film;
a first contact hole in the insulating film and that exposes a first side surface of the oxide semiconductor layer, the first side surface being non-parallel with the first surface of the oxide semiconductor layer, wherein the first contact hole is sloped towards the first side surface of the oxide semiconductor layer, wherein in a cross-sectional view of the thin film transistor, the first contact hole has two parallel sides sloped towards the first side surface of the oxide semiconductor layer;
a second contact hole in the insulating film and that exposes a second side surface of the oxide semiconductor layer, the second side surface being non-parallel with the first surface of the oxide semiconductor layer;
a source electrode in the first contact hole and having a portion that contacts the first side surface of the oxide semiconductor layer;
a drain electrode in the second contact hole and having a portion that contacts the second side surface of the oxide semiconductor layer, the oxide semiconductor layer, first gate electrode, source electrode and drain electrode arranged in a coplanar transistor configurationand
a light-blocking element arranged to shield a second surface of the oxide semiconductor layer from external light, wherein the light-blocking element comprises a light-shielding layer that is a second gate electrode.

2. The thin film transistor of claim 1, wherein the second surface of the oxide semiconductor layer is opposite to the first surface of the oxide semiconductor layer, and the light-blocking element shields the second surface of the oxide semiconductor layer from the external light.

3. The thin film transistor of claim 2, further comprising:
at least one buffer layer disposed between the flexible substrate and the second surface of the oxide semiconductor layer,
wherein the light-shielding layer is disposed within the at least one buffer layer.

4. The thin film transistor of claim 1, wherein the light-shielding layer entirely overlaps the oxide semiconductor layer.

5. The thin film transistor of claim 1, wherein the light-shielding layer entirely overlaps a channel region of the oxide semiconductor layer.

6. The thin film transistor of claim 1, wherein a distance between the light-shielding layer and the second surface of the oxide semiconductor layer is equal to or less than 3 μm.

7. The thin film transistor of claim 1, wherein a distance between the light-shielding layer and the second surface of the oxide semiconductor layer is between 500 Å to 2000 Å.

8. The thin film transistor of claim 1, wherein the first gate electrode and the light-shielding layer are commonly addressable and receive the same voltage, respectively.

9. The thin film transistor of claim 1, wherein the first gate electrode is separately addressable from the light-shielding layer.

10. The thin film transistor of claim 1, wherein the light-blocking element comprises:
a plurality of layers comprising a first layer and a second layer adjacent to the first layer, the first layer and the second layer having different refractive indices that define a critical angle for light refraction, the first layer and the second layer shielding the second surface of the oxide semiconductor layer from portions of the external light having an incidence angle greater than the critical angle.

11. The thin film transistor of claim 10, wherein the first layer has a first refractive index and the second layer has a second refractive index that is lower than the first refractive index, the second layer being closer to the oxide semiconductor layer than the first layer.

12. The thin film transistor of claim 10, wherein the plurality of layers comprise:
a third layer having a third refractive index that is lower than the second refractive index, the third layer being adjacent to the second layer and closer to the oxide semiconductor layer than the second layer.

13. The thin film transistor of claim 10, wherein the plurality of layers comprise:
a third layer having a third refractive index that is the same as the first refractive index.

14. The thin film transistor of claim 1, wherein a size of the oxide semiconductor layer is substantially same as a size of the first gate electrode.

15. A display device, comprising:
a flexible substrate;
a thin film transistor comprising:
an oxide semiconductor layer on the flexible substrate and having a channel in a surface of the oxide semiconductor layer;
a first gate electrode formed on the oxide semiconductor layer, a first surface of the oxide semiconductor layer facing the first gate electrode;
an insulating film;
a first contact hole in the insulating film and that exposes a first side surface of the oxide semiconductor layer, the first side surface being non-parallel with the first surface of the oxide semiconductor layer, wherein the first contact hole is sloped towards the first side surface of the oxide semiconductor layer, wherein in a cross-sectional view of the thin film transistor, the first contact hole has two parallel sides sloped towards the first side surface of the oxide semiconductor layer;
a second contact hole in the insulating film and that exposes a second side surface of the oxide semiconductor layer, the second side surface being non-parallel with the first surface of the oxide semiconductor layer;
a source electrode in the first contact hole and having a portion that contacts the first side surface of the oxide semiconductor layer;
a drain electrode in the second contact hole and having a portion that contacts the second side surface of the oxide semiconductor layer, the oxide semiconductor layer, first gate electrode, source electrode and drain electrode arranged in a coplanar transistor configuration; and
a light-blocking element arranged to shield a second surface of the oxide semiconductor layer from external light; and
a display element operatively connected to the thin film transistor,
wherein the light-blocking element comprises a light shielding layer that is a second gate electrode.

16. The display device of claim 15, wherein the display element comprises an anode, a cathode and an organic light-emitting layer interposed between the anode and the cathode, and wherein the anode is electrically connected to the thin film transistor.

17. The display device of claim 15, wherein the display element comprises a pixel electrode, a common electrode and a liquid crystal layer, and wherein the pixel electrode is electrically connected to the thin film transistor.

18. A semiconductor device comprising:
a flexible substrate;
a buffer layer structure, on the flexible substrate, that reduces permeation of moisture or impurities through the flexible substrate;
a co-planar thin film transistor having a gate electrode, a source electrode and a drain electrode in a co-planar configuration on the buffer layer structure over the flexible substrate;
an oxide semiconductor layer, on the buffer layer structure and under the co-planar thin film transistor, the oxide semiconductor having a channel region between the source electrode and the drain electrode, the oxide semiconductor layer having a lower surface in contact with the buffer layer structure;
an insulating film; and
a contact hole in the insulating film and that exposes a side surface of the oxide semiconductor layer that is non-parallel with the lower surface of the oxide semiconductor layer, one of the source electrode and the drain electrode being located in the contact hole and being in contact with the side surface of the oxide semiconductor layer, wherein the contact hole is sloped towards the side surface of the oxide semiconductor layer, wherein in a cross-sectional view of the co-planar thin film transistor, the first contact hole has two parallel sides sloped towards the side surface of the oxide semiconductor layer;
wherein the buffer layer structure has a particular configuration for shielding against light from affecting the oxide semiconductor layer and the light is caused by internal reflections within the semiconductor device and is caused by a source external from the semiconductor device.

19. The semiconductor device of claim 18, wherein the buffer layer structure comprises a metal layer and an insulating layer surrounding the metal layer.

20. The semiconductor device of claim 19, wherein the distance between the oxide semiconductor layer and the metal layer is equal to or less than 3μm.

21. The semiconductor device of claim 19, wherein a size of the metal layer is determined based on a size of a channel region as well as the distance between the metal layer and the oxide semiconductor layer.

22. The semiconductor device of claim 21, wherein the size of the metal layer is equal to or greater than the oxide semiconductor layer.

23. The semiconductor device of claim 18, wherein the buffer layer structure is configured to protect the oxide semiconductor layer from the light when a support substrate is removed or released from the flexible substrate by laser.

24. The semiconductor of claim 18, wherein the metal layer is configured to be a secondary gate electrode.

25. The semiconductor of claim 24, wherein the distance between the metal layer and the oxide semiconductor layer is 500Å to 2000Å.

26. The semiconductor device of claim 25, wherein the gate electrode and the metal layer are commonly addressable or individually addressable.

27. The semiconductor device of claim 18, wherein the buffer layer structure comprises a plurality of insulating layer with different refractive indices.

28. The semiconductor device of claim 18, wherein the source electrode and the drain electrode shield the oxide semiconductor layer from the light.

29. A thin film transistor comprising:
an oxide semiconductor layer on a flexible substrate and having a channel in a surface of the oxide semiconductor layer;
a first gate electrode on the oxide semiconductor layer;
a gate insulating film between the oxide semiconductor layer and the first gate electrode;
an interlayer insulating film on the first gate electrode;
a first contact hole in the interlayer insulating film that exposes a first side surface of the oxide semiconductor layer, the first side surface being non-parallel with the surface of the oxide semiconductor layer having the channel, wherein the first contact hole is sloped towards the first side surface of the oxide semiconductor layer, wherein in a cross-sectional view of the thin film transistor, the first contact hole has two parallel sides sloped towards the first side surface of the oxide semiconductor layer;
a second contact hole in the interlayer insulating film that exposes a second side surface of the oxide semiconductor layer, the second side surface being non-parallel with the surface of the oxide semiconductor layer having the channel; and
a source electrode and a drain electrode positioned on the interlayer insulating film, the source electrode electrically connected to the first side surface of the oxide semiconductor layer via the first contact hole, and the drain electrode electrically connected to the second side surface of the oxide semiconductor layer via the second contact hole,
wherein the gate insulating film is only on the oxide semiconductor layer,
the oxide semiconductor layer, first gate electrode, source electrode and drain electrode are arranged in a coplanar transistor configuration, and
a portion of the source electrode covers the first side surface of the oxide semiconductor layer, and a portion of the drain electrode covers the second side surface of the oxide semiconductor layer.

30. The thin film transistor of claim 29, wherein a width of the gate insulating film is substantially the same as a width of the first gate electrode at an area where the gate insulating film is in contact with the first gate electrode, and both sides of the gate insulating film directly contact the interlayer insulating film.

31. The thin film transistor of claim 29, further comprising:
a light-blocking element arranged to shield a bottom surface of the oxide semiconductor layer from external light and including a second gate electrode.

32. The thin film transistor of claim 31, wherein the light-blocking element further includes a plurality of layers comprising a first layer and a second layer, the first layer and the second layer having different refractive indices that define a critical angle for light refraction, the first layer and the second layer shielding the oxide semiconductor layer from the external light having an incidence angle greater than the critical angle.

33. The thin film transistor of claim 29, wherein the source electrode does not overlap with the oxide semiconductor layer along a vertical cross sectional direction and the drain electrode does not overlap with the oxide semiconductor layer along the vertical cross sectional direction.

* * * * *